United States Patent
Yasseri et al.

(10) Patent No.: US 12,270,748 B2
(45) Date of Patent: Apr. 8, 2025

(54) METHOD AND APPARATUS FOR MEASURING PARTICLES

(71) Applicant: LAM RESEARCH CORPORATION, Fremont, CA (US)

(72) Inventors: Amir A. Yasseri, San Jose, CA (US); Girish M. Hundi, Dublin, CA (US); John Michael Kerns, Livermore, CA (US); Duane Outka, Fremont, CA (US); John Daugherty, Fremont, CA (US); Cliff La Croix, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 272 days.

(21) Appl. No.: 17/273,264

(22) PCT Filed: Sep. 5, 2019

(86) PCT No.: PCT/US2019/049783
§ 371 (c)(1),
(2) Date: Mar. 3, 2021

(87) PCT Pub. No.: WO2020/055665
PCT Pub. Date: Mar. 19, 2020

(65) Prior Publication Data
US 2021/0341377 A1    Nov. 4, 2021

Related U.S. Application Data

(60) Provisional application No. 62/730,320, filed on Sep. 12, 2018.

(51) Int. Cl.
*G01N 15/1434* (2024.01)
*G01N 1/22* (2006.01)
*G01N 15/14* (2024.01)

(52) U.S. Cl.
CPC ....... *G01N 15/1434* (2013.01); *G01N 1/2205* (2013.01); *G01N 2015/1486* (2013.01)

(58) Field of Classification Search
None
See application file for complete search history.

(56) References Cited

U.S. PATENT DOCUMENTS

| | | | | |
|---|---|---|---|---|
| 6,119,368 A | * | 9/2000 | Masterson | H01L 21/67017 34/410 |
| 7,173,257 B1 | * | 2/2007 | Warrick | G01N 21/53 250/458.1 |
| 8,747,609 B2 | * | 6/2014 | Iizuka | H01J 37/3266 118/715 |
| 2002/0104617 A1 | * | 8/2002 | Kim | H01L 21/67017 156/345.33 |

(Continued)

FOREIGN PATENT DOCUMENTS

| | | |
|---|---|---|
| CN | 104250728 | 12/2014 |
| EP | 1688731 | 8/2006 |

(Continued)

OTHER PUBLICATIONS

Translation of Bae (KR 2013/00119740) (Year: 2013).*

(Continued)

*Primary Examiner* — Rufus L Phillips
(74) *Attorney, Agent, or Firm* — Beyer Law Group LLP

(57) ABSTRACT

An apparatus for measuring contamination on a critical surface of a part is provided. A vessel for mounting the part is provided. An inert gas source is in fluid connection with the vessel and adapted to provide an inert gas to the vessel. At least one diffuser receives the inert gas from the vessel, wherein the critical surface of the part is exposed to the inert gas when the part is mounted in the vessel. At least one analyzer is adapted to receive inert gas from the at least one diffuser and measures contaminants in the inert gas.

13 Claims, 3 Drawing Sheets

(56) References Cited

U.S. PATENT DOCUMENTS

| | | | |
|---|---|---|---|
| 2005/0016700 A1* | 1/2005 | Hoffmann | D21D 5/24 |
| | | | 406/173 |
| 2007/0190474 A1* | 8/2007 | Su | F27D 19/00 |
| | | | 432/37 |
| 2009/0063078 A1* | 3/2009 | Chandler | G01N 15/0205 |
| | | | 702/81 |
| 2009/0183630 A1* | 7/2009 | Vroman | H01L 21/67017 |
| | | | 95/45 |
| 2011/0212625 A1* | 9/2011 | Toyoda | C23C 16/4585 |
| | | | 438/758 |
| 2012/0075625 A1* | 3/2012 | Tamura | G01N 21/9506 |
| | | | 356/237.5 |
| 2015/0004798 A1 | 1/2015 | Chandrasekharan et al. | |
| 2015/0276572 A1 | 10/2015 | Thovex et al. | |
| 2018/0211850 A1* | 7/2018 | Kondoh | H01L 21/67766 |
| 2020/0072724 A1* | 3/2020 | Knollenberg | G01N 1/02 |
| 2021/0098251 A1* | 4/2021 | Nakagawa | C23C 16/4412 |

FOREIGN PATENT DOCUMENTS

| | | |
|---|---|---|
| JP | 2002-280315 | 9/2002 |
| JP | 2014-003228 | 1/2014 |
| KR | 1998-0055050 | 9/1998 |
| KR | 1998-055050 | 9/1998 |
| KR | 2003-0065292 | 8/2003 |
| KR | 10-0556258 | 3/2006 |
| KR | 2013-0019740 | 2/2013 |
| KR | 10-1257481 | 4/2013 |

OTHER PUBLICATIONS

Translation of Ahn (KR 2003/0065292) (Year: 2003).*
International Search Report from International Application No. PCT/US2019/049783 dated Jan. 20, 2020.
Written Opinion from International Application No. PCT/US2019/049783 dated Jan. 20, 2020.
Taiwanese Office Action from Taiwanese Application No. 108132531 dated Apr. 14, 2023.
Japanese Office Action from Japanese Application No. 2021-513912 dated May 23, 2023.
Chinese Office Action from Chinese Application No. 201980059751.1 dated Oct. 10, 2023 with Machine Translation.
Korean Office Action from Korean Application No. 10-2021-7010538 dated Aug. 5, 2024 with Machine Translation.

* cited by examiner

METHOD AND APPARATUS FOR MEASURING PARTICLES

CROSS REFERENCE TO RELATED APPLICATION

This application claims the benefit of priority of U.S. Application No. 62/730,320, filed Sep. 12, 2018, which is incorporated herein by reference for all purposes.

BACKGROUND

The present disclosure generally relates to methods and apparatuses for measuring particles on a part. More specifically, the present disclosure relates to methods and apparatuses for measuring residue particles on critical chamber parts for a plasma processing chamber.

In forming semiconductor devices, plasma chambers have parts where the presence of particles on the parts may cause contamination in the formation of the semiconductor devices.

SUMMARY

To achieve the foregoing and in accordance with the purpose of the present disclosure, an apparatus for measuring contamination on a critical surface of a part is provided. A vessel for mounting the part is provided. An inert gas source is in fluid connection with the vessel and adapted to provide an inert gas to the vessel, wherein the critical surface of the part is exposed to the inert gas when the part is mounted in the vessel. At least one diffuser receives the inert gas from the vessel. At least one analyzer is adapted to receive the inert gas from the at least one diffuser and measures contaminants in the inert gas.

In another manifestation, a method for testing a part for contaminants is provided. The part is placed in a test vessel. An inert gas is flowed through the test vessel, wherein the test vessel flows the inert gas past one or more critical surfaces of the part. The inert gas is flowed from the test vessel to at least one diffuser. The inert gas is flowed from the at least one diffuser to a particle counter. The contaminants are measured in inert gas using the particle counter.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

Figure 1:
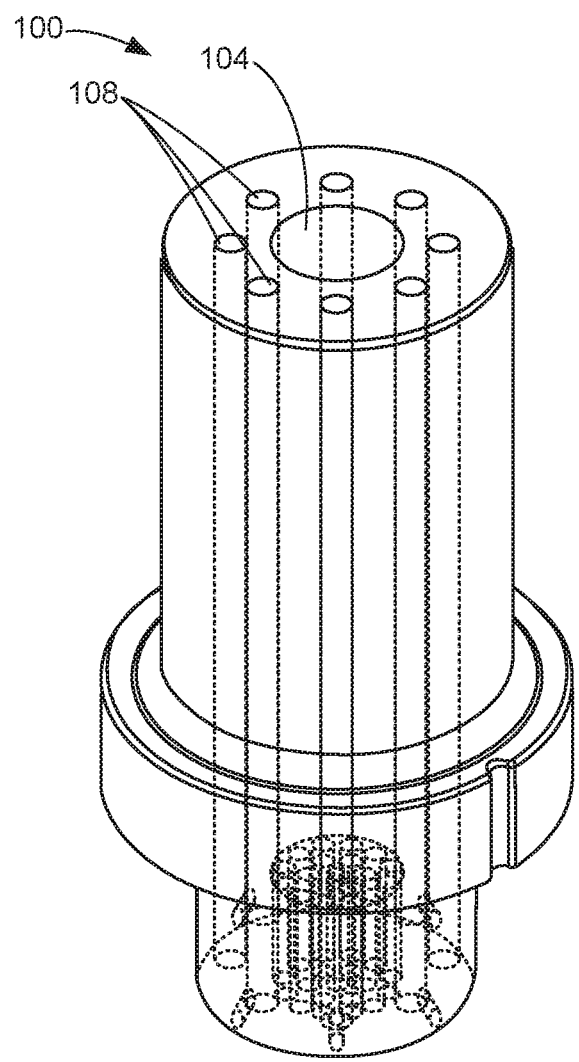
FIG. 1 is a gas injector used in an embodiment.

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Semiconductor fabrication equipment process modules including etch and deposition tools use critical hardware components within a wafer process chamber. Submicron and nano-sized particle loading on any etch and/or deposition module part prior to or upon installation must be avoided. The avoidance of such particles ensures that the next generation chamber part materials can meet the stringent defectivity demands at ever decreasing technology nodes. Unclean, out of the box, critical parts may lead to numerous defect issues on a wafer upon initial startup of a process module. Defect issues cause adverse and unwanted impact on many different areas including, e.g., tool startup time, application qualification, product yield, and overall system productivity, etc. To avoid defect issues, ceramic surfaces of newly fabricated critical chamber parts must be cleaned to a high precision using robust cleaning methods that target removal of larger particle contaminants and submicron and nano-sized particles that may also reside on the parts.

In addition, semiconductor process chamber equipment surfaces must be cleaned periodically in order to maintain the desired process module cleanliness for overall tool performance, reliability and productivity. The extent of cleaning can extend to numerous surfaces of materials that are incorporated in the mechanical equipment being used throughout the process modules either as new or used parts. Typically, key chamber critical part cleaning is required when there are strict out of the box low defect level requirements or when the performance of used parts reaches unacceptable levels. Part cleaning may be performed when tools must be opened to replace parts or as part of a routinely scheduled maintenance. Part cleaning is done to ensure that overall quality performance is maintained throughout the lifecycle of the equipment. The effective removal of surface contaminants can be further aided by cleaning agents that are designed for the specific materials being removed. Hence, surface cleanliness must be validated afterwards to ensure that the contamination buildup has in fact been removed. Described below are some common traditional methods to validate parts surface particle cleanliness. These traditional methods have limitations for being indirect, unable to detect localized cleanliness variations, require removal of the part for ex-situ destructive analysis that, in turn, introduces background contaminants, uncertainty in the sampling location, or a combination thereof.

One way of validating the cleanliness of a part is by using a surface scanner particle counter. In a surface scanner particle counter, a laser scanning mechanism is used to survey the surface under test. The surface scanner particle counters are designed for use on wafers, flat panels, or disk drives. Blanket monitor wafers in this case are generally used as a diagnostic tool to test for presence of particle and metal contaminates in strategic process locations. Particle levels are recorded on each wafer before the wafer is positioned in designated locations. The wafers are typically left over an extended period, e.g., a twenty-four hour period. The wafers are then collected and rescanned to identify any particle adders. Although effective, this method is an indirect measure of the cleanliness of a part. This method cannot directly detect localized cleaning variations on the part surfaces. In addition, such particle counters cannot be used to detect intermittent emission of particle contaminant materials coming from the part, the cleaning or manufacturing processes.

A second way that the cleanliness of a part is commonly validated is by optical particle counting. Optical particle counting generally utilizes water as a common medium along with some type of energy to excite and extract particles from a surface and transport them onto an optical particle counter. The most common method involves the use of ultra pure water, an ultrasonic transducer, and a tank that is large enough to hold the part that is to be tested. The initial water cleanliness is verified and the part is then immersed into the tank. The ultrasonic transducer is activated for a predetermined period of time at a specific frequency. The water is then passed through the liquid particle counter to determine and record the water cleanliness. The pre- and post-particle data are compared to determine the cleanliness of the part. The advantage of this method is that a complete part can be tested to determine cleanliness levels.

The disadvantage is that this process is an indirect measurement method subject to particle transport issues. In addition, this process has high background contributions from numerous potential extraneous sources including water, fixtures, and tooling. In addition, this process is subject to the potential alteration of the physical and chemical properties of the particle either by the submersion in water or by ultrasonic energy damage. This method also cannot detect localized cleaning variations on the part surface. In addition, the method usually requires the part to be removed from the semiconductor tool and sent to a specialized lab for analysis. Ex-situ analysis of the part is a time consuming process and may require the tool to remain in a non-functional state until the part is returned.

An alternative to the above method is to use an airborne or aerosol particle counter with a specialized probe head. For example, pressurized air jets on the outside of the probe head blow inwardly over the surface. At the center of the head is a vacuum inlet where particles are essentially sucked off the surface and transported to an aerosol particle counter. This method has some unique advantages in that the aerosol particle counter is extremely portable and any flat surface can be measured. However, obvious disadvantages are that the accuracy of the measurement is affected by the environment around the object under test and the test is only limited to line of sight flat surfaces. In addition, not all particles from the surface may be removed and counted due to the fact that the probe head is hand held. In addition, the speed at which the surface is scanned, the localized flow velocities, as well as the planarity of the probe to the surface all affect the particle count levels.

One last example of cleanliness validation is the traditional magnified visual inspection (optical microscopy). This involves using a microscope and counting particles under the field of view. This method is limited to small parts that can be moved to the microscope and measured, or to the use of specialized microscopes that can be attached to tools or fixtures to view these parts. If the part is small enough, it can be placed into an analysis chamber such as a scanning electron microscope with an energy dispersive X-ray spectroscopy (SEM/EDX) machine. More typically, the part is too large to fit in a standard analysis chamber, so the part needs to be cut into a volume small enough for direct surface analysis. Cutting is not ideal because the process itself can generate particles. Disadvantages of cutting are that cutting is labor intensive and is limited to what can fit under the microscope. A slight variation to magnified visual inspection utilizes tape or contact surfaces to contact the surface under test and then the tape or contact surface is viewed under the microscope or SEM.

In these regards, this disclosure discloses a methodology to validate the surface particle cleanliness of a chamber critical part for semiconductor wafer fabrication equipment. An embodiment can be used to measure localized cleanliness, is non-destructive, does not require removal and placement of the part into a liquid medium in a tank, does not introduce high background particle contamination noise, and can be done at final stages prior to packaging. This disclosure also describes a particle measurement system and an inert gas partitioned based purge method that detects for particle cleanliness in-line on a part prior to final packaging. These unique characteristics allow an operator to isolate and screen critical surfaces of a part to high precision, monitor, diagnose, and validate the particle cleanliness just prior to final packaging.

Considering the dimensions, geometry, the complexity of gas delivery critical parts, accessibility to all critical surfaces of a part is extremely difficult. Conventional surface sensitive analytical techniques could not be used unless significant efforts are made to modify instrumentation to allow access to all of the critical surfaces of a part.

Alternatively, bulk liquid-based sampling techniques to extract the particles and then analyze them also face similar challenges. Such techniques to recover a minute quantity of samples from large surface areas are not ideal in this case, because they require extremely high detection sensitivity from the analysis method with reduced background noise. The need for higher sensitivity is due to several reasons. One reason is that a significant amount of signal from background contributions can occur during the sampling process. If a minute amount of particle contamination from the material is to be detected from a large part by rinsing or immersing the entire part, that signal representing the minute amount is often lost in the noise. Other reasons may be attributed to the inefficiency of the sample recovery technique. If the material is chemically inert, it makes analysis complicated and oftentimes extremely challenging. Moreover, the same characteristics also limit follow up validations of surface cleanliness after the surface has undergone a cleaning procedure to remove the particles.

An embodiment affords the ability to measure internal vacuum wetted network of critical chamber parts in-line with reduced background noise. The embodiment provides a way to directly sample the emission stream collected from a part with one or more analyzers put in parallel that cover the range of particles from micron to nano sized via split stream analysis. The embodiment utilizes minimal contact points on non-critical surfaces to selectively introduce and confine a pre-cleaned/processed inert purge gas stream to areas of interest on the part. The sweep flow is distributed through the chamber to achieve good uniformity through the test piece and dislodge particles into a mobile phase that can be sampled downstream with the on-board array of analyzers. A fixture vessel design minimizes dead hold up volume and potential contributions from particles that can be generated via alternative handling-based methods to increased background particle levels. The fixture vessel design affords optimal resident time, air flow velocity, and flow uniformity. The method and hardware are designed to handle production parts screening at high volumes within a clean room in a compact footprint design. The method and hardware can be fully automated for increased productivity and reduced cost. Embodiments may be used to screen parts during manufacturing to determine issues that may impact yield, such as debris from poor cleaning, poor surface finish, or poor machining operations. Various embodiments may be scaled to accommodate larger chamber parts.

FIG. 1 is a perspective view of a gas injector 100 used in a plasma processing chamber. The gas injector 100 has a large central bore 104 and eight smaller peripheral bores 108. The central bore 104 provides gas to a central region of the plasma processing chamber. The peripheral bores 108 provide gas to peripheral regions surrounding the central region. The central bore 104 and peripheral bores 108 are gas injection passages. In some embodiments, the gas flowing through the central bore 104 may have a different flow rate than gas flowing through the peripheral bores 108. The difference in flow rates may be accomplished by having one gas feed for the central bore 104 and another gas feed for the peripheral bores 108.

When such a gas injector 100 is manufactured, the gas injector 100 is cleaned to remove contaminants. In the alternative, after extended usage, a gas injector 100 is cleaned in order to recondition the gas injector 100 for further usage. After cleaning, the gas injector 100 should be inspected to confirm that the cleaning process has sufficiently cleaned the gas injector 100. If the gas injector 100 is not sufficiently cleaned, the gas injector 100 will cause an increased number of defects on processed substrates and/or the seasoning of the plasma processing chamber will take longer, causing a decrease in throughput of the plasma processing chamber.

Figure 2:
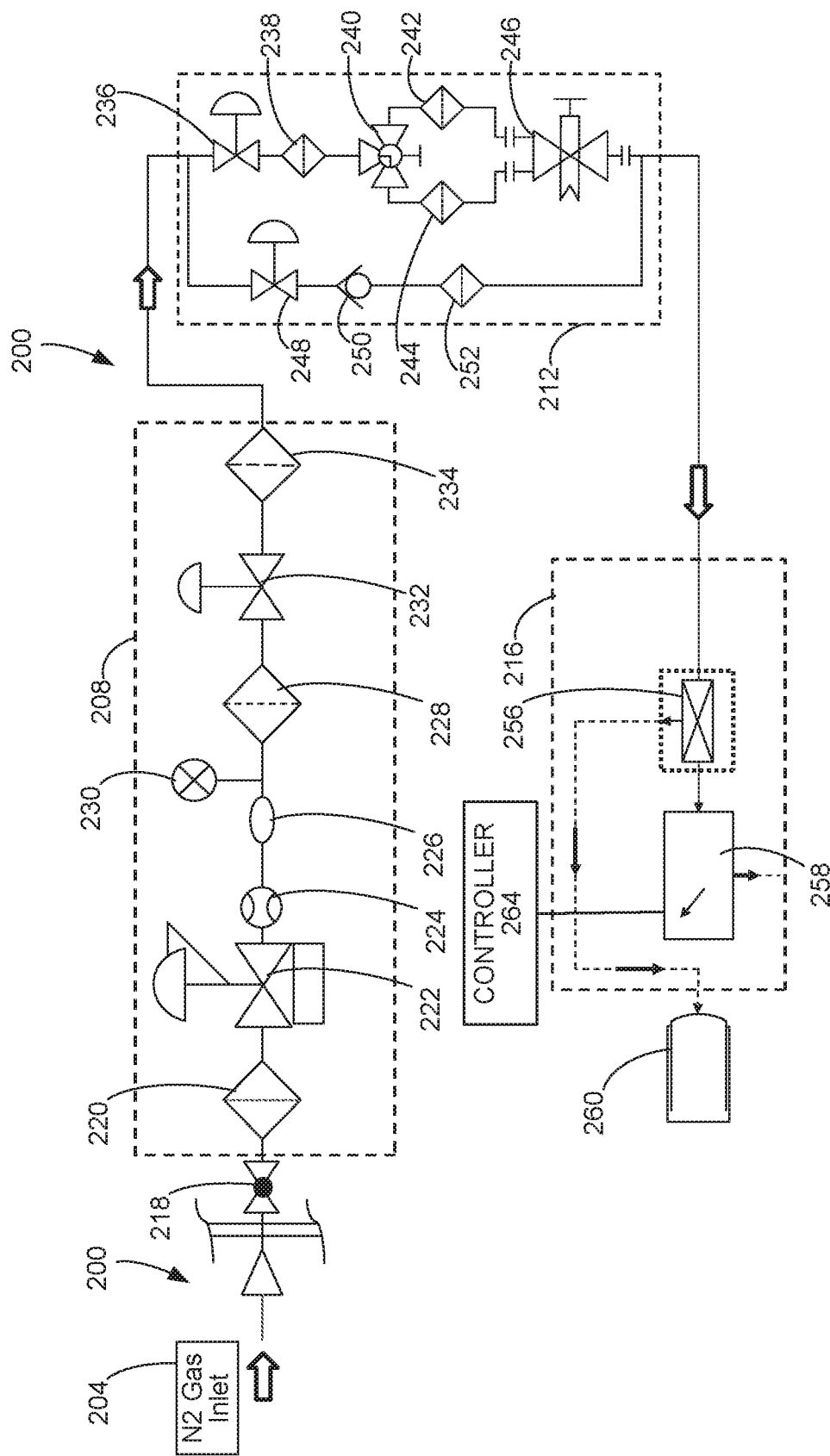
FIG. 2 is a schematic view of an embodiment.

FIG. 2 is a schematic view of an embodiment of an inspection system 200. This embodiment comprises a gas source 204, a gas conditioning system 208, a vessel gas system 212, and a particle counting system 216. In this embodiment, the gas source 204 supplies nitrogen ($N_2$). $N_2$ is an inert gas. An inert gas is defined as a gas that does not chemically react with the surface of the part to be tested or inspected. In addition to nitrogen, the gas source 204 may supply other types of inert gases in other embodiments. The gas source 204 provides gas to the gas conditioning system 208 through a ball valve 218. The gas conditioning system 208 comprises a double layer membrane filter 220, a regulator with a pressure gauge 222, a flow meter 224, a flow controller 226, a first electronic grade filter 228, an electronic grade pressure gauge 230, a first electronic grade pneumatic valve 232, and a second electronic grade filter 234. The double layer membrane filter 220 receives input from an output of the ball valve 218. An output of the double layer membrane filter 220 is connected to an input of the regulator with a pressure gauge 222. An output of the regulator with a pressure gauge 222 is connected to an input of the flow meter 224. In this embodiment, the flow meter 224 provides a flow from between 0 to 10 standard cubic feet per minute (scfm) (0-283 standard liters per minute (slm)). An output of the flow meter 224 is connected to an input of the flow controller 226. An output of flow controller 226 is connected to an input of the first electronic grade filter 228. The electronic grade pressure gauge 230 is connected between the flow controller 226 and the first electronic grade filter 228. An output of the first electronic grade filter 228 is connected to an input of the first electronic grade pneumatic valve 232. An output of the first electronic grade pneumatic valve 232 is connected to an input of the second electronic grade filter 234.

An output of the second electronic grade filter 234 is connected to the vessel gas system 212. The vessel gas system 212 comprises two parallel legs including a vessel leg and a bypass leg. The vessel leg comprises a second electronic grade pneumatic valve 236, a third electronic grade filter 238, a three-way ball valve 240, a fourth electronic grade filter 242, a fifth electronic grade filter 244, and a test vessel 246. The output of the second electronic grade filter 234 is connected to an input of the second electronic grade pneumatic valve 236. An output of the second electronic grade pneumatic valve 236 is connected to an input of the third electronic grade filter 238. An output of the third electronic grade filter 238 is connected to an input of the three-way ball valve 240. A first output of the three-way ball valve 240 is connected to an input of the fourth electronic grade filter 242. A second output of the three-way ball valve 240 is connected to an input of the fifth electronic grade filter 244. An output from the fourth electronic grade filter 242 is connected to a central feed of the test vessel 246. An output of the fifth electronic grade filter 244 is connected to a peripheral feed of the test vessel 246.

The bypass leg comprises a third electronic grade pneumatic valve 248, a check valve 250, and a sixth electronic grade filter 252. The output of the second electronic grade filter 234 is connected to an input of the third electronic grade pneumatic valve 248. An output of the third electronic grade pneumatic valve 248 is connected to an input of the check valve 250. The output of the check valve 250 is connected to an input of the sixth electronic grade filter 252.

An output of the test vessel 246 and an output of the sixth electronic grade filter 252 are connected to an input of the particle counting system 216. The particle counting system 216 comprises a high pressure diffuser 256 and a particle counter 258. The output of the test vessel 246 and the output of the sixth electronic grade filter 252 are connected to an input of the diffuser 256. The diffuser 256 has a first output to the particle counter 258 and a second output to exhaust 260.

Figure 3:
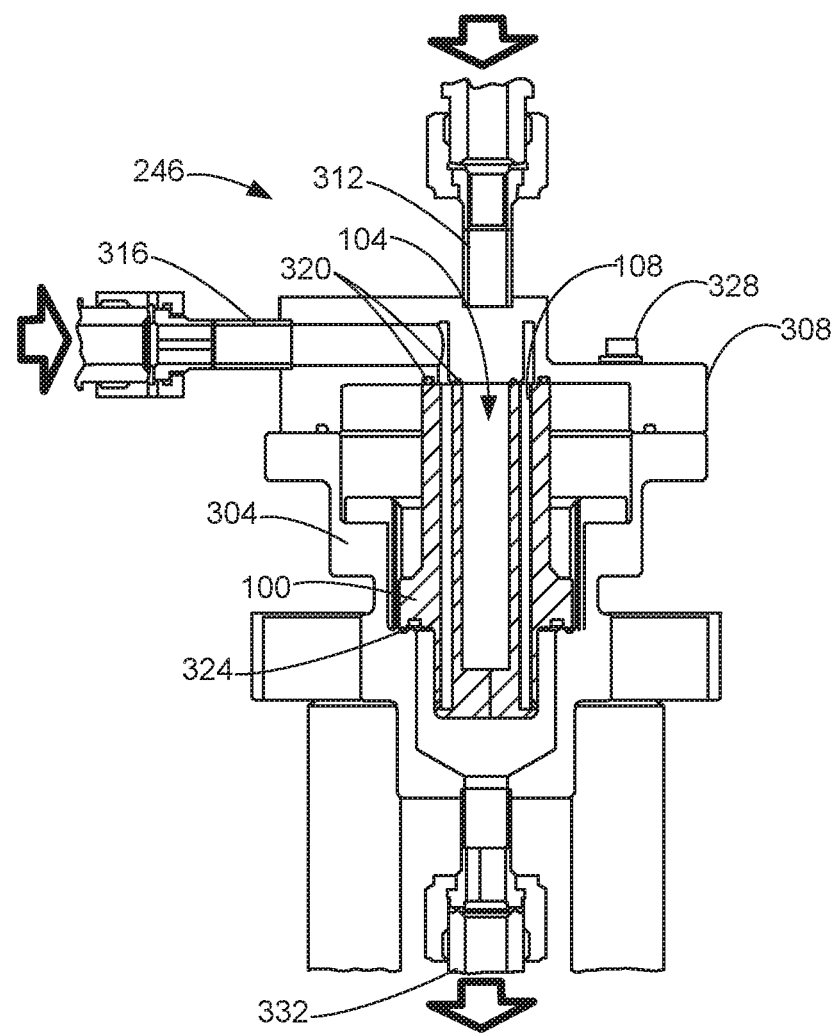
FIG. 3 is a cross sectional view of a test vessel with the gas injector.

FIG. 3 is a cross sectional view of the test vessel 246 holding a gas injector 100. The gas injector 100 has the central bore 104 and the peripheral bores 108. The test vessel 246 has a body 304 and a cap 308. The cap 308 comprises the central feed 312 and peripheral feed 316. The central feed 312 is in fluid connection with the central bore 104. The peripheral feed 316 is in fluid connection with the peripheral bores 108. Cap O-rings 320 are between the cap 308 and the gas injector 100 to create a gas seal between the central feed 312 and the central bore 104 and between the peripheral feed 316 and the peripheral bores 108. The body 304 has a body O-ring 324 to form a gas seal between the body 304 and the gas injector 100. One or more bolts 328 connect the body 304 to the cap 308. Gas flowing through the central bore 104 and peripheral bores 108 of the gas injector 100 are directed to an output 332 of the test vessel 246.

Parts of a plasma processing chamber have critical surfaces. Critical surfaces are surfaces that are exposed to plasma or a process gas in the plasma processing chamber. In this embodiment, the test vessel 246 is designed to flow the inert gas past at least 90% of the critical surfaces of the gas injector 100. In addition, most of the non-critical surface of the gas injector 100 is not exposed to the flow of the inert gas. Such non-critical surfaces may not need to be cleaned. The primary goal is to test if the critical surfaces are sufficiently clean. Therefore, the non-critical surfaces of the gas injector 100 would not be tested. In addition, the test vessel 246 is designed so that contact by the test vessel 246 or cap O-rings 320 or body O-ring 324 is not on the critical surfaces of the gas injector 100. Instead, the cap O-rings 320 and body O-ring 324 form a gas seal around the critical surfaces. Contact with the critical surfaces of the gas injector 100 would deposit contaminants on the critical surfaces of the gas injector 100. The deposition of contaminants on the critical surfaces of the gas injector 100 would necessitate a new cleaning of the gas injector 100.

In operation, the gas injector 100 is mounted in the test vessel 246, as shown in FIG. 3. The test vessel 246 is connected to the particle counting system 216. The gas source 204 provides nitrogen ($N_2$) to the gas conditioning system 208. The gas conditioning system 208 cleans and adjusts the flow of the gas. The gas passes from the gas source 204 through the ball valve 218. The ball valve 218 starts and stops the flow of the gas from the gas source 204 to the gas conditioning system 208. The double layer membrane filter 220 filters contaminants in the gas from the gas source 204 and the ball valve 218. The regulator with a pressure gauge 222 is used to set and monitor the facility supply line pressure while the system is being used. The flow meter 224 provides a desired and/or specified flow rate. The flow controller 226 is used to set and monitor the flow rate, while the system is being used to ensure there is sufficient gas flow while a system blank vessel or load part is being tested. The electronic grade pressure gauge 230 monitors the downstream pressure. The first electronic grade filter 228 removes contaminants from the flow meter 224 and the flow controller 226. The first electronic grade pneumatic valve 232 controls the flow supply to the vessel gas system 212 located downstream. The second electronic grade filter 234 removes contaminants from the first electronic grade pneumatic valve 232 to provide to the vessel gas system 212 a clean inert gas at a desired and/or specified pressure and flow rate.

In the vessel gas system 212, the second electronic grade pneumatic valve 236 and third electronic grade pneumatic valve 248 control the relative flow rates between the vessel leg and a bypass leg. The third electronic grade filter 238 removes contaminants from the second electronic grade pneumatic valve 236. The three-way ball valve 240 divides the gas flow in the vessel leg and controls the relative flow rate to the central feed and the peripheral feed. The fourth electronic grade filter 242 the fifth electronic grade filter 244 remove contaminants from the three-way ball valve 240.

The three-way ball valve 240 is set so that gas flows through the central bore 104 or the peripheral bores 108 at relatively equal and high speeds independently. For example, the flow rates through the central bore 104 and the peripheral bores 108 are from 2 to 50 standard liters per minute. The flow through the central bore 104 and the peripheral bores 108 would have a flow velocity from 4 to 100 feet per second (1.2 to 30.5 meters per second). The ratio of the flow velocities through the central bore 104 and any of the peripheral bores 108 may vary. In one embodiment, the ratio of the flow velocities is substantially even, ranging, e.g., from 3:2 and 2:3. The test vessel 246 is designed to minimize dead regions adjacent to the critical surfaces, so that the flow of the inert gas covers at least 90% of the critical surfaces. As a result, the gas can be used to help detect contaminants from at least 90% of the critical surfaces of the gas injector 100. By providing a substantially even flow velocity across the different critical surfaces, the contamination measurement across the different critical surfaces is substantially even.

The check valve 250 of the bypass leg prevents gas from flowing backwards from the output of the test vessel 246 to the third electronic grade pneumatic valve 248. The sixth electronic grade filter 252 filters contaminants from the check valve 250 and the third electronic grade pneumatic valve 248.

Gas exiting from the test vessel 246 and the bypass leg is combined and provided to the particle counting system 216.

The diffuser 256 receives gas from the vessel gas system 212 at a high pressure and flow rate. In one embodiment, the particle counter 258 is designed to handle a low flow of gas at ambient pressure. Due to the low flow, the diffuser 256 vents most of the gas directly to the exhaust 260, lowering the flow rate and pressure of gas provided to the particle counter 258. The particle counter 258 is able to sample a portion of the gas and measure the concentration of contaminants. The measurement is then subsequently used to determine if the gas injector 100 is sufficiently clean. Gas from the particle counter 258 is vented to the exhaust 260. A controller 264 may receive data or measurement from the particle counter 258. The data may be used by the controller 264 to then determine whether or not the gas injector 100 is sufficiently clean based on desired and/or specified criteria.

In an embodiment, the particle counter 258 may be a laser-based diode particle counter that is able to count particles that are greater than or equal to 0.1 µm. In another embodiment, the output from the diffuser 256 may be fed to a second diffuser (not shown). The second diffuser is connected to a second particle counter (not shown). The diffuser 256 and second diffuser are connected sequentially. In other embodiments a plurality of diffusers are connected in parallel. The second particle counter may count particles that are less than 0.1 µm, such as nanometer size particles. The combination of particle counters would allow the counting of particles with different sizes, ranging from, for example, less than 0.1 µm to greater than 5 µm. In another embodiment, the output from the vessel gas system 212 may be split up and provided concurrently to the diffuser 256 and the second diffuser, the second diffuser being similarly connected to the second particle counter. Other embodiments may use other combinations of particle counters.

Embodiments described herein can be used to test parts more quickly than other prior art methods. Instead of using a probe that can only scan small regions of a part, embodiments are able to test at least 90% of the critical surfaces at one time. In addition, a probe may require a line of sight test for regions in the part. Embodiments use a gas flow for regions where there is no line of sight. The critical surfaces may be vacuum wetted critical surfaces. Vacuum wetted critical surfaces are surfaces exposed to process gases that are used for the plasma processing. In this embodiment, the vacuum wetted critical surfaces would be the surfaces of the gas injector 100 that are exposed to gases passing through the gas injector 100 to the plasma processing chamber.

In various embodiments, the inert gas may be nitrogen, helium, clean compressed dry air, or argon. In other embodiments, additional excitation energy sources may be included to aid the removal of contaminants. For example, gas injector 100 may be subjected to ultrasonic energy to further remove contaminants during testing. Other types of excitation energy may include mechanical vibration, impact shock, gas pulsing, thermal treatment, use of ionizers and/or atmospheric plasma, etc.

In other embodiments, the part that is measured for contamination may be other gas delivery parts of the plasma processing chamber. The gas delivery parts include the gas injector 100 and other parts, such as gas weldments, gas showerheads, electrostatic chucks with gas channels, or manifolds, with critical surfaces. Such manifolds may be mixing manifolds between a gas source and the gas injector 100.

In other embodiments, the flow of the inert gas past critical surfaces in the test vessel 246 simulates gas flow through the plurality of gas injection passages during operational use of the gas injector 100. In other embodiments, at least one of the flow rate and pressure of the inert gas through the test vessel 246 is varied.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. An apparatus for measuring contamination on critical surfaces of a part for use in a processing chamber, wherein the part has critical surfaces, wherein the critical surfaces of the part are surfaces exposed to a plasma or process gas in the processing chamber, wherein the part is a gas injector, wherein the gas injector has a plurality of gas injection passages, comprising:
   a vessel for mounting the part, wherein when the part is mounted in the vessel, the vessel only contacts the part outside of the critical surfaces, wherein the vessel is adapted to flow the inert gas past 90% to 100% of the critical surfaces of the part at one time, wherein the inert gas is flowed past all surfaces of the plurality of gas injection passages, wherein the inert gas is flowed past all surfaces of the plurality of gas injection passages at one time;
   an inert gas source in fluid connection with the vessel and adapted to provide an inert gas to the vessel, wherein the critical surfaces of the part are exposed to the inert gas when the part is mounted in the vessel;
   at least one seal to create a seal around the critical surfaces, wherein none of the at least one seal contacts the critical surfaces, wherein the critical surfaces of the part are surfaces exposed to a plasma or process gas in the processing chamber;
   at least one diffuser for receiving the inert gas from the vessel; and
   at least one analyzer adapted to receive the inert gas from the at least one diffuser and measure contaminants in the inert gas.

2. The apparatus, as recited in claim 1, further comprising a gas conditioning system in fluid connection between the inert gas source and the vessel, wherein the gas conditioning system filters the inert gas from the inert gas source.

3. The apparatus, as recited in claim 2, wherein the gas conditioning system comprises:
   a flow controller that controls at least one of a flow rate and a pressure of the inert gas;
   a plurality of valves; and
   a plurality of filters, wherein each of the plurality of valves is adjacent to and upstream from a corresponding one of the plurality of filters.

4. The apparatus, as recited in claim 3, wherein the gas conditioning system is adapted to provide a flow rate of at least 10 standard liters per minute.

5. The apparatus, as recited in claim 1, wherein there are no valves located between the vessel and the at least one analyzer.

6. The apparatus, as recited in claim 1, further comprising a three-way ball valve adapted to allow a flow of the inert gas past all surfaces of the plurality of gas injection passages to simulate a gas flow through the plurality of gas injection passages during operational use.

7. The apparatus, as recited in claim 1, wherein the vessel is adapted to flow the inert gas through the plurality of gas injection passages, so that a ratio of flow velocity of the inert gas between any two gas injection passages of the plurality of gas injection passages is between 3:2 and 2:3.

8. The apparatus, as recited in claim 1, wherein the part is a gas weldment, gas showerhead, electrostatic chuck, or manifold.

9. The apparatus, as recited in claim 1, wherein the at least one diffuser comprises a plurality of diffusers coupled sequentially.

10. The apparatus, as recited in claim 1, wherein the at least one diffuser comprises a plurality of diffusers coupled in parallel, wherein at least one diffuser of the plurality of diffusers vents at least some inert gas.

11. The apparatus, as recited in claim 1, wherein the at least one seal comprises at least one O-ring, wherein none of the at least one O-ring contacts the critical surfaces.

12. The apparatus, as recited in claim 1, wherein the diffuser vents most of the gas directly to the exhaust.

13. An apparatus for measuring contamination on critical surfaces of a part for use in a processing chamber, wherein the part has critical surfaces, wherein the critical surfaces of the part are surfaces exposed to a plasma or process gas in the processing chamber, wherein the part is a gas injector, wherein the gas injector has a plurality of gas injection passages, comprising:
   a vessel for mounting the part, wherein when the part is mounted in the vessel, the vessel only contacts the part outside of the critical surfaces, wherein the vessel is adapted to flow the inert gas past 90% to 100% of the critical surfaces of the part at one time, wherein the inert gas is flowed past all surfaces of the plurality of gas injection passages, wherein the vessel comprises cap and body;
   an inert gas source in fluid connection with the vessel and adapted to provide an inert gas to the vessel, wherein the critical surfaces of the part are exposed to the inert gas when the part is mounted in the vessel;
   at least one seal to create a seal around the critical surfaces, wherein none of the at least one seal contacts the critical surfaces, wherein the critical surfaces of the part are surfaces exposed to a plasma or process gas in the processing chamber wherein the at least one seal comprises at least a first O-ring that separates the cap from the gas injector and seals the gas injection passages and at least a second O-ring that separates the body from the gas injector and seals the gas injection passages and wherein the first O-ring and the second O-ring do not contact critical surfaces;
   at least one diffuser for receiving the inert gas from the vessel; and
   at least one analyzer adapted to receive the inert gas from the at least one diffuser and measure contaminants in the inert gas.

* * * * *